(12) United States Patent
Kelberlau et al.

(10) Patent No.: US 7,071,537 B2
(45) Date of Patent: Jul. 4, 2006

(54) POWER DEVICE HAVING ELECTRODES ON A TOP SURFACE THEREOF

(75) Inventors: Ulrich Kelberlau, Lampertheim (DE); Nathan Zommer, Los Altos, CA (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 10/430,569

(22) Filed: May 5, 2003

(65) Prior Publication Data

US 2003/0214012 A1    Nov. 20, 2003

Related U.S. Application Data

(60) Provisional application No. 60/381,629, filed on May 17, 2003.

(51) Int. Cl.
*H01L 29/861*    (2006.01)

(52) U.S. Cl. ........................ 257/603; 257/481

(58) Field of Classification Search ........ 257/133–145, 257/335–343, 476–479, 621
See application file for complete search history.

(56) References Cited

U.S. PATENT DOCUMENTS

| | | | | |
|---|---|---|---|---|
| 5,278,431 A * | 1/1994 | Das | ............................ | 257/77 |
| 5,286,995 A * | 2/1994 | Malhi | .......................... | 257/549 |
| 5,323,041 A * | 6/1994 | Matsushita et al. | ......... | 257/339 |
| 5,583,365 A * | 12/1996 | Villa et al. | .................. | 257/409 |
| 5,897,355 A * | 4/1999 | Bulucea et al. | .............. | 438/273 |
| 6,297,533 B1 * | 10/2001 | Mkhitarian | ................. | 257/336 |
| 6,365,932 B1 * | 4/2002 | Kouno et al. | ............... | 257/341 |
| 6,503,779 B1 | 1/2003 | Miyazaki | | |
| 6,518,089 B1 | 2/2003 | Coyle | | |
| 6,534,876 B1 | 3/2003 | Glenn | | |
| 6,576,506 B1 * | 6/2003 | Shibib | ......................... | 438/197 |

* cited by examiner

*Primary Examiner*—Howard Weiss
*Assistant Examiner*—Marcos D. Pizarro-Crespo
(74) *Attorney, Agent, or Firm*—Townsend and Townsend and Crew LLP (57) ABSTRACT

A power device includes a substrate assembly including an upper surface and a lower surface. The substrate assembly includes a first layer and a second layer. The first layer overlies the second layer and has different conductivity than the second layer. A first electrode is provided proximate the upper surface. A second electrode is provided proximate the upper surface and is spaced apart from the first electrode. The second layer is configured to provide a current path between the first and second electrodes.

17 Claims, 5 Drawing Sheets

POWER DEVICE HAVING ELECTRODES ON A TOP SURFACE THEREOF

CROSS-REFERENCES TO RELATED APPLICATIONS

The present application claims priority to U.S. Provisional Application No. 60/381,629, filed on May 17, 2002, which is incorporated by reference.

BACKGROUND OF THE INVENTION

Power semiconductor devices, e.g., metal-oxide-semiconductor field effect transistors ("MOSFETs), insulated gate bipolar transistors ("IGBTs"), or diodes, include semiconductor dice, which are cut from a wafer. Large active areas are needed in order to conduct high currents, e.g., 1 ampere or more. As a result, the main current flow is directed vertically from one main surface (top surface) to an opposing main surface (bottom surface).

Figure 1:
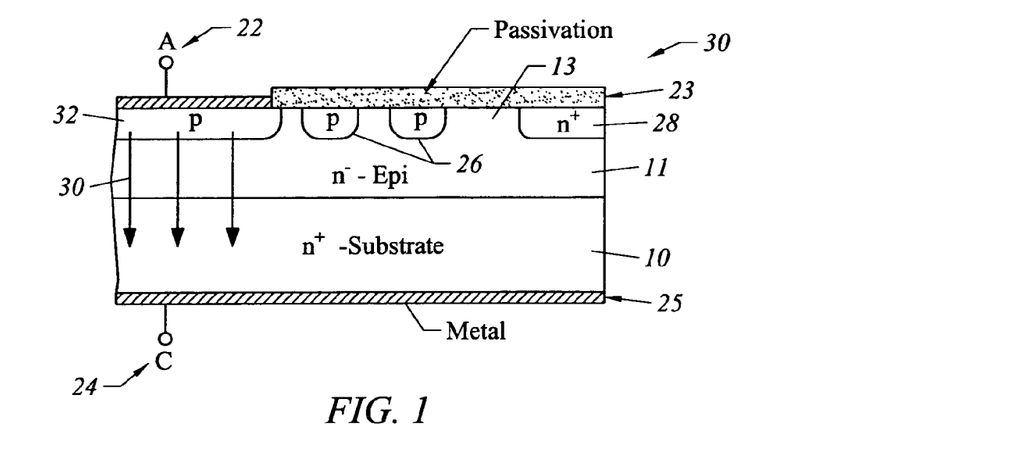
FIG. 1 illustrates a cross-sectional view of a diode having an anode and a cathode on opposing sides of a substrate assembly.

FIG. 1 illustrates a conventional diode 50 including a highly-doped, low resistivity substrate 10 and a lightly-doped, high resistivity layer 11 deposited on the substrate 10. The layer 11 is generally formed using an epitaxial growth method and is commonly referred to as an "epi-layer". The epi-layer 11 is generally also referred to as an n− layer since it is generally an n type and is lightly doped. The substrate 10, depending on the desired device type, is either n+ or p+ doped. The diode includes an anode 22 provided on a top surface 23 and a cathode 24 provided on a bottom surface 25. The anode and cathode are generally metal, e.g., aluminum. A plurality of guard rings 26 and a channel stopper 28 are formed on the top surface to reduce electrical fields on the top surface and provided a desired blocking voltage rating for the die. A passivation layer 13 covers the top surface to protect the diode. A current 30 flows from a p-doped region 32 coupling the anode to the cathode.

Figure 2:
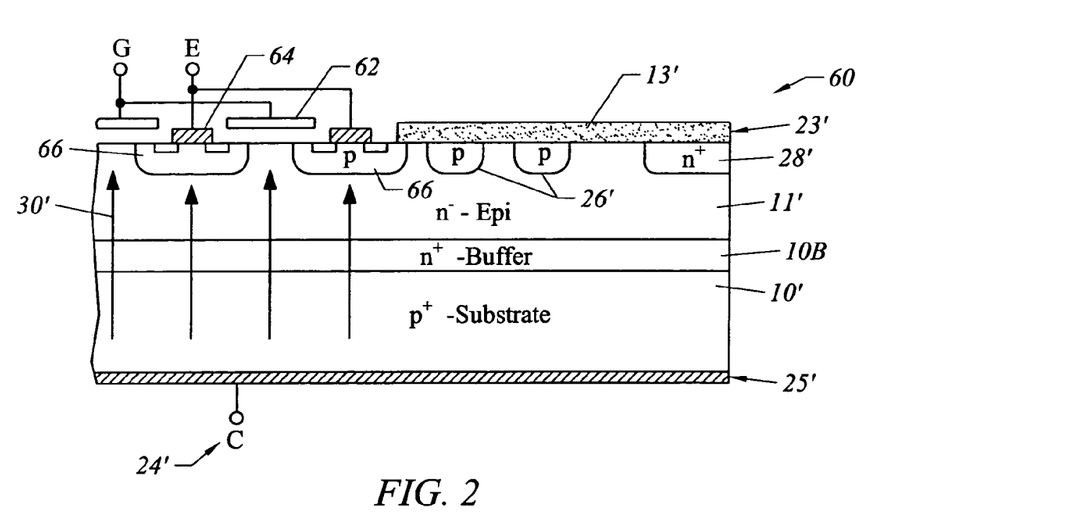
FIG. 2 illustrates a cross-sectional view of an insulated gate bipolar transistor having a source (emitter) and a drain (collector) on opposing sides of a substrate assembly.

FIG. 2 illustrates a conventional IGBT 60 including a highly-doped, low resistivity substrate 10', a buffer n+ layer 10B deposited on the substrate, and a lightly-doped, high resistivity layer 11' deposited on the buffer layer. The substrate is p+ substrate. The layer 11' is generally formed using an epitaxial growth method and is commonly referred to as an "epi-layer". The IGBT includes a gate 62 and an source (emitter) 64 provided on a top surface 23' and a drain (collector) 24' provided on a bottom surface 25'. A plurality of guard rings 26' and a channel stopper 28' are formed on the top surface to reduce electrical fields on the top surface. A passivation layer 13' is formed overlying the top surface to protect the IGBT. A current 30' flows from the drain 24' to p-wells 66 coupled to the gate and emitter.

For n channel epitaxial diodes (or MOSFETs), the substrate is n+. For n channel IGBT, the substrate is p+. The cathode 24 or drain 24' provided on the backside of the die has an unpatterned metal contact across its surface. The metal on the top surface is patterned to form, for example, the anode in case of a the diode, or the source and gate in case of a MOSFET or IGBT.

The dice above are packaged into power devices using encapsulant or plastic. The size of the packaged power device is bigger than it could otherwise be since the electrodes (e.g., the anode 22 or the gate 64) provided on the top surface is wire bonded to leads, which requires added height and width to the package since the wires extend upwardly and outwardly from the gate and source regions.

BRIEF SUMMARY OF THE INVENTION

Embodiments of the present invention relates to a power device having all electrodes on one side of the die to minimize the size of a packaged power device. Depending on the application and assembly technique used for the device, it is often desirable to have all the electrical contacts for the device on its main top surface, especially for "flip chip" assembly techniques. In such technique the die is generally contacted to a separate substrate, or a printed circuit board ("PCB"), where all contact pads of the die are connected with their corresponding metal lines of the circuit without using wire-bonding between the die and the external electrodes (e.g., solder bumps). In one embodiment, the power device is generally configured to handle current of 1 ampere or more and/or operating voltages of 70 volts or higher.

Accordingly, the power device disclosed herein is different than conventional high-density, integrated circuits, e.g., DRAMs or SOCs, that have electrodes on the top surface and are configured to be used in flip-chip assembly techniques. These high-density devices generally handle low voltages and currents; therefore, they use relatively small doped wells formed within semiconductor substrates as current channels.

In one embodiment, a power device having all electrodes on the top surface is obtained by using "a sinker" that forms a conductive path through an epi layer from the top surface of a substrate assembly to the doped substrate. The substrate assembly refers to a substrate, wafer, die, or the like that provides an area for forming a power device. Generally, the substrate assembly includes a doped substrate (or doped layer) and an epi layer provided over the doped substrate.

The sinker is a highly doped region and may be formed by ion implantation and diffusion thereafter to drive the dopants into the substrate assembly. The sinker is n+ type if the substrate is n+ type, and p+ type if the substrate is p+ type. The formation of sinker may require a relatively long processing time since the dopants or impurities may need to be driven deeply into the substrate assembly to form a conductive path that connects the doped substrate to an electrode provided on the top surface of the substrate assembly, particularly for devices having thick epi layers (e.g., 50 micron or greater).

In addition, the conductive path formed by the sinker may not have uniform conductivity since the dopant concentration tends to less near the doped substrate than at the top surface of the wafer. Accordingly, in certain embodiments of the present invention, a groove or trench is used rather than a sinker. However, the present invention is not limited to power devices having such grooves or trenches to form conductive paths.

In one embodiment, the sinker is formed using a method that is similar to that used in forming a continuous diffusion region, described in U.S. patent application Ser. No. 10/099,927, filed on Mar. 13, 2002, assigned to the assignee of the present application, which is incorporated by reference. That is, the sinker extends from a top surface to a bottom surface of the substrate.

In one embodiment, a method for making a power device includes providing a substrate assembly having a first layer of first conductivity and a second layer of second conductivity below the first layer. The second conductivity of the second layer has greater conductivity than the first conductivity of the first layer. The substrate assembly has a first surface and a second surface. A conductive region extending from the first surface and into the first and second layers of the substrate assembly is formed. A first electrode proximate the first surface of the substrate assembly is formed. A second electrode proximate the first surface of the substrate assembly and apart from the first electrode is formed. The second electrode is electrically coupled to the conductive region. A current flows between the first and second electrodes via the second layer and conductive region. The conductive region extends from the first surface to the second surface, the first and second surfaces being on opposing sides of the substrate assembly. The conductive region is formed by introducing impurities from the first and second surfaces of the substrate assembly. The impurities introduced from the first surface is different than the impurities introduced from the second surface. The impurities introduced from the first surface is boron, and the impurities introduced from the second surface is aluminum.

In one embodiment, a power device includes a substrate assembly including an upper surface and a lower surface. The substrate assembly includes a first layer and a second layer. The first layer overlies the second layer and has different conductivity than the second layer. A first electrode is provided proximate the upper surface. A second electrode is provided proximate the upper surface and is spaced apart from the first electrode. The second layer is configured to provide a current path between the first and second electrodes.

In another embodiment, a power device includes a first layer of first conductivity having a first surface and a second surface. A second layer of second conductivity is provided below the second surface. The second layer has a higher conductivity than the first layer. A first electrode is provided proximate the first surface of the first layer. A groove extends into the second layer from the first surface of the first layer. A second electrode is formed overlying the groove and contacting the second layer.

In yet another embodiment, a method for forming a power device on a substrate assembly includes forming a trench extending from an upper surface of the substrate assembly and into at least a portion of a doped substrate provided underneath a lightly-doped layer of the substrate assembly. A first electrode is formed proximate the upper surface of the substrate assembly. A conductive layer is deposited over the trench to form a second electrode that is electrically coupled to the doped substrate. The doped substrate provides a conductive path between the first and second electrodes. The trench is formed using a saw. The trench formed by the saw is etched, e.g., isotropic etching, to repair a surface of the substrate assembly that is damaged by the saw. The trench may be formed by applying a physical force to the substrate assembly, e.g., a physical force applied by contacting a mechanical tool to the substrate assembly.

DETAILED DESCRIPTION OF THE INVENTION

Figure 3:
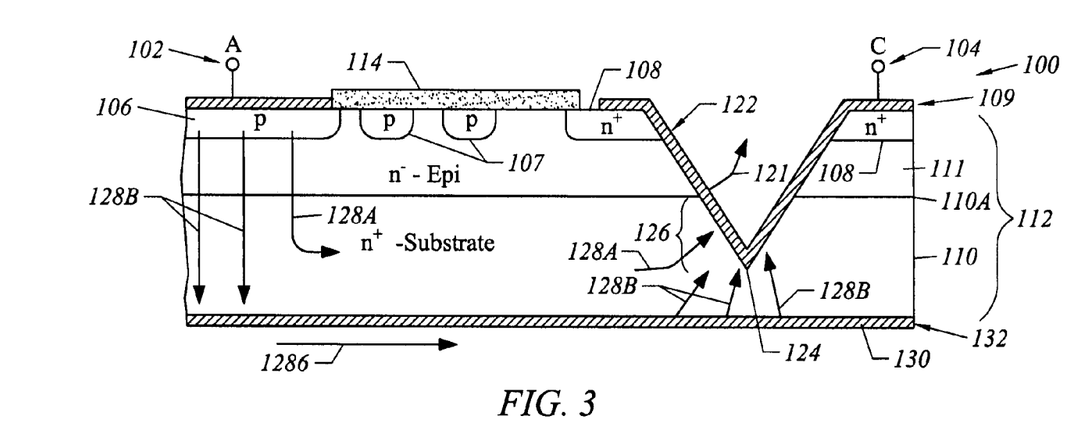
FIG. 3 illustrates a cross-sectional view of a diode having an anode and a cathode on the same side of a substrate assembly according to one embodiment of the present invention.

FIG. 3 illustrates a diode 100 having an anode 102 and a cathode 104 provided overlying an n+ substrate 110 according to one embodiment of the present invention. A lightly-doped, epi layer 111 is formed on the substrate. The epi layer is n− layer with n type impurities, e.g., phosphorous. The n type impurities have a concentration ranging from about $10^{13}$ atoms/cm$^3$ to about $10^{17}$ atoms/cm$^3$, and is preferably at about $5 \times 10^{13}$ atoms/cm$^3$ to $5 \times 10^{15}$ atoms/cm$^3$. Similarly, the n+ substrate has n type impurities, e.g., phosphorous, of a concentration ranging from about $10^{17}$ atoms/cm$^3$ to about $10^{19}$ atoms/cm$^3$, and is preferably at about $5 \times 10^{18}$ atoms/cm$^3$. Of course, other concentrations may also be provided depending on the particular application.

The substrate 110 has a thickness of about 200 micron to about 600 micron, preferably about 300 micron to about 400 micron. The epi layer 111 has a thickness of no more than about 130 micron. The thickness of epi layer is varied according to the desired breakdown voltage. Generally, the breakdown voltage of the device increases about 10 volts for each additional micron added to the thickness of the n− epi layer. For example, the epi layer 111 with a thickness of 50 micron provides a breakdown voltage of about 500 volts. The concentration of the impurities in the epi layer also affects the breakdown voltage of the device. In the present embodiment, the epi layer 111 is typically no more than about 130 micron since it is very expensive to provide an epi-layer that is more than 130 micron.

The anode 102 couples the epi layer via a p-well region 106 having p type impurities, e.g., boron. The boron is diffused into the epi-layer during a high temperature process and has a concentration at the surface 109 ranging from about $10^{16}$ atoms/cm$^3$ to about $10^{20}$ atoms/cm$^3$, preferably about $10^{18}$ atoms/cm$^3$. A plurality of guard rings 107 and a channel stopper 108 are formed on a top surface 109 of a substrate assembly 112 to reduce electrical fields on the top surface. The substrate assembly includes the substrate 110 and the epi layer 111 in the present embodiment. Accordingly, the substrate assembly may refer to a wafer, die, substrate, or the like. As used herein, the term "substrate assembly" refers to a material (e.g., substrate, die, or wafer) with at least two regions, layers, or portions having different conductivities. A passivation layer 114 is formed over the top surface 109 to protect the wafer including the guard rings and channel stopper. In one embodiment, the passivation layer is silicon dioxide.

The cathode 104 is formed by forming a groove or trench 121 extending into the substrate assembly 112 and contacting the substrate 110. In one embodiment, the groove 121 penetrates an upper surface 110A of the substrate 110, so that a lower surface or tip 124 of the groove extends into the substrate 110 for a given depth, e.g., about 5 micron or more, 20 micron or more, or 50 micron or more. A lower portion 126 that contacts the substrate 110 serves as a contact electrode to receive currents 128 flowing from the anode 102. The current may reach the lower portion 126 of the cathode via the substrate 110 (i.e., current 128a) or via a metal layer 130 (or conductive path) provided at a backside 132 of the substrate 110 (i.e., current 128b). In one embodiment, the diode 100 does not include the metal layer 130, and the currents 128 all reach the lower portion 126 via the substrate 110. The metal layer 130 is generally not used when the thickness of the substrate or substrate assembly is greater than the distance between the anode to the cathode.

Figure 4:
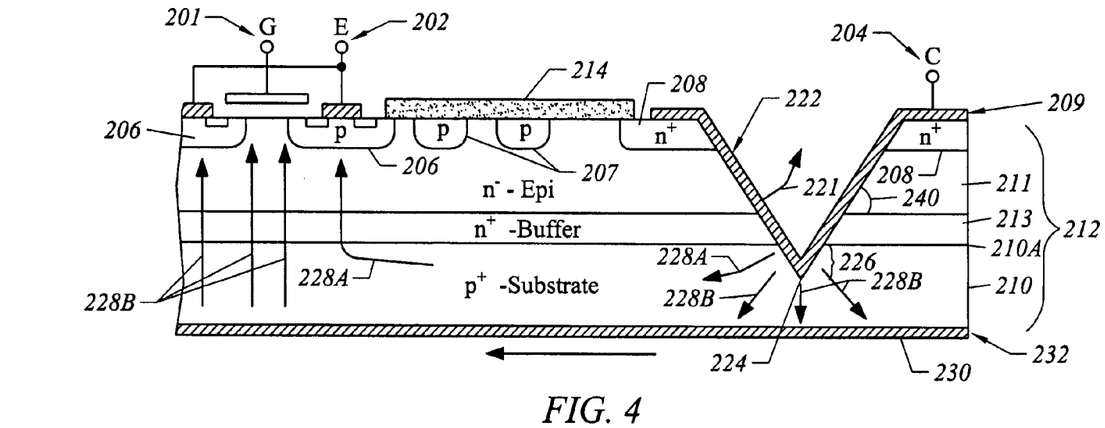
FIG. 4 illustrates a cross-sectional view of an insulated gate bipolar transistor having a source (emitter) and a drain (collector) on the same side of a substrate assembly according to one embodiment of the present invention.

FIG. 4 illustrates an IGBT 200 having a gate 201, a source 202, and a drain 204 on an upper surface 209 of a substrate assembly 212 according to one embodiment of the present invention. The substrate assembly includes a p type substrate 210, an n+ buffer layer 213 provided on the substrate, and an n− layer 211 on the buffer layer. The substrate 210 includes p type impurities, e.g., boron, to increase its conductivity. The n− layer 211 is a lightly-doped, epi layer having n type impurities, e.g., phosphorous. The n type impurities have a concentration ranging from about $10^{13}$ atoms/cm$^3$ to about $10^{17}$ atoms/cm$^3$, and is preferably at about $5 \times 10^{13}$ atoms/cm$^3$ to $5 \times 10^{15}$ atoms/cm$^3$. The buffer layer 213 has n type impurities, e.g., phosphorous, of a concentration ranging from about $10^{15}$ atoms/cm$^3$ to about $10^{19}$ atoms/cm$^3$, and is preferably at about $10^{17}$ atoms/cm$^3$. Of course, other concentrations may also be provided depending on the particular application.

The substrate 210 has a thickness of about 200 micron to about 600 micron, preferably about 300 micron to about 400 micron. The epi layer 211 has a thickness of at least about 1 micron, preferably 5 micron or more, and no more than about 130 micron in the present embodiment. The thickness of epi layer is varied according to the desired breakdown voltage. Generally, the breakdown voltage of the device increases about 10 volts for each additional micron added to the thickness of the n− epi layer, as explained before. The concentration of the impurities in the epi layer also affects the breakdown voltage of the device. In the present embodiment, the epi layer 211 is no more than about 130 micron.

The substrate assembly 212 includes a plurality of p-wells 206 to define the gate and source regions. One or more guard rings 207 and a channel stopper 208, doped regions, are formed on the upper surface 209. In one embodiment, the guard rings and the channel stopper are provided between the source and the drain. A passivation layer 214 is deposited overlying the substrate assembly to protect the IGBT 200.

The drain 204 is formed by forming a groove or trench 221 extending into the substrate assembly 212 and depositing a conductive layer 222 (e.g., aluminum) into the groove. In the present embodiment, a groove is used rather than a sinker for fabrication convenience. In one implementation, the groove 221 penetrates into the substrate 210, so that a lower surface or tip 224 of the groove extends into the substrate 110 at least about 5 micron below an upper surface 210A of the substrate 210. In one embodiment, the tip 224 is at least 20 micron or more below the upper surface 210A, or at least 50 micron or more below the upper surface 210A, thereby providing a greater contact area between the a lower portion 226 of the drain 204 and the substrate 210 to facilitate the flow of a current 228 from the drain to source. The current may reach the source 202 via the substrate 210 (i.e., current 228a) or via a metal layer 230 provided at a backside 232 of the substrate 210 (i.e., current 228b). The metal layer 230 is optional according to desired application. For example, the metal layer 230 may be used where the distance between the source and drain is significant or to lower the on-resistance of the IGBT by providing an additional conductive path at the backside.

In one embodiment, the lower portion of the groove 221 forms an angle 240 with a surface parallel to the upper surface 209 of the substrate. The angle is at least 30 degrees, preferably about 45 degrees to minimize the lateral extension of the drain area. However, the lower portion may have different angular profiles, as explained below. The tip 224 is provided with a round edge to prevent excessive electrical field concentration at that location.

As will be understood by those skilled in the art, the description of the above embodiment may be applied to power MOSFETs. Power MOSFETs have similar structures to the IGBTs. One difference is that the power MOSFET has a substrate that is n+ doped, whereas the IGBT has a p+ doped substrate.

Figure 5A:
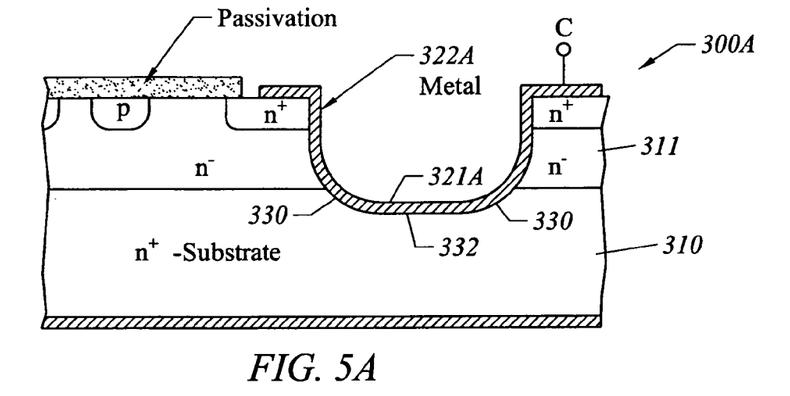
FIG. 5A illustrates a substrate assembly with a trench extending into a doped substrate that is provided below an epi layer, where the trench is formed using an etch method according to one embodiment of the present invention.
Figure 5B:
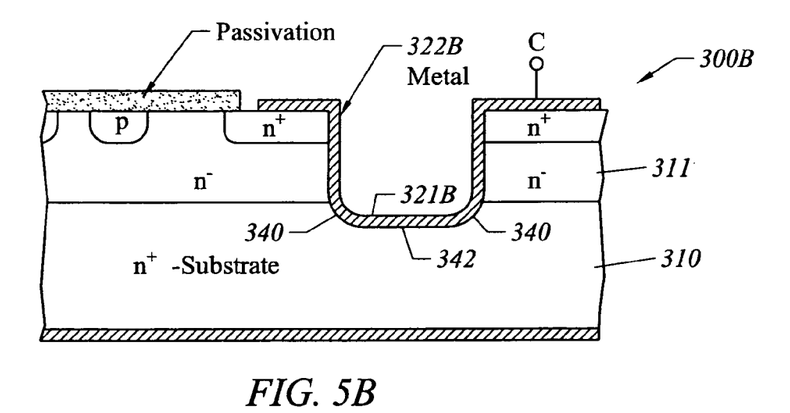
FIG. 5B illustrates a substrate assembly with a trench extending into a doped substrate that is provided below an epi layer, where the trench is formed using a rectangular saw according to one embodiment of the present invention.
Figure 5C:
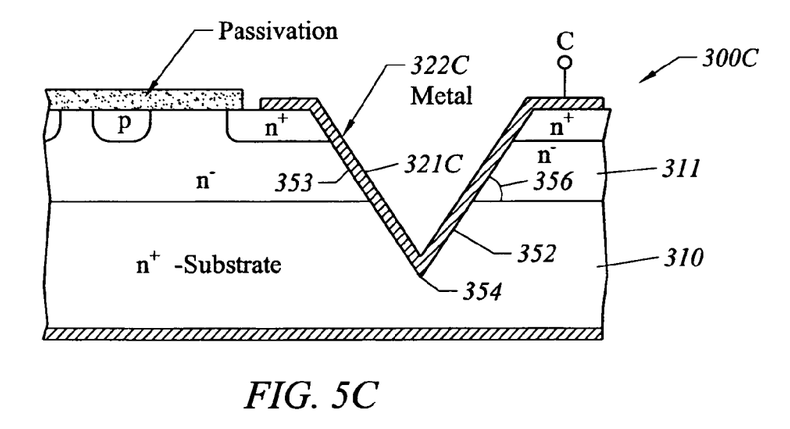
FIG. 5C illustrates a substrate assembly with a trench extending into a doped substrate that is provided below an epi layer, where the trench is formed using a V-shaped saw according to one embodiment of the present invention.

FIGS. 5A–5C illustrates power devices, e.g., diodes, having trenches of various shapes according to embodiments of the present invention. Although these figures illustrate power devices having diode configurations, the description below applies to other power devices, e.g., IGBTs. FIG. 5A shows a power device 300A including a trench 321A extending into a substrate 310 and an epi layer 311. The trench 321A has rounded bottom corners 330 and a lower surface with a gradual slope, e.g., 30 degrees or less, or 15 degrees or less. The trench may have a depth of 130 micron or more, 150 micron or more, or 200 micron or more. In one embodiment, the trench 321A is formed using a wet or dry etch method, e.g., an isotropic etch method.

The trench 321A is formed by depositing and patterning an etch mask, e.g., photoresist layer (not shown). If the epi layer 311 is thick and a deep trench is required, a lengthy etching step may be required, particularly for dry etching. The lengthy etch may degrade the integrity of the etch mask at one or more places and unintended etching to occur at those locations, thereby damaging the wafer and reducing die yield.

FIGS. 5B and 5C illustrates power devices 300B and 300C having trenches 321B and 321C formed using a mechanical tool (not shown), e.g., a saw, according to embodiments of the present invention. In one embodiment, a saw used for dicing a wafer is used to saw into the substrate assembly to form the trenches 321B and 321C.

FIG. 5B illustrates the trench 321B that has been formed using a rectangular-shaped saw. Accordingly, the trench 321B has a substantially flat lower surface 342. The trench 321B is provided with rounded bottom corners 340 to avoid sharp edges thereon that may degrade device performance. The corners 340 may be rounded by using a saw having rounded corners or using an isotropic etch after the sawing process to round the corners.

FIG. 5C illustrates a trench 321C including a lower portion 352 and an upper portion 353 formed by using a V-shaped saw. Accordingly, the trench 321C has a V-shaped lower portion 352. A tip 354 of the trench is generally round to prevent formation of a cathode or drain having sharp edges. An etch step, e.g., an isotropic etch, may be performed after the sawing step to smooth the surfaces of the wafer that have been damaged from the sawing process. In one embodiment, the lower portion of the trench 321C is provided with a slope of 356 of about 45 degrees for better metal layer coverage in the trench. In another embodiment, a saw having a V-shaped tip and a rectangular body is used, so that the trench is provided with a V-shaped lower portion (as shown in FIG. 5C) and a rectangular (or vertical) upper portion (not shown).

In one embodiment, a metal layer 322A, 322B, or 322C are deposited into the trench to form an ohmic contact with the substrate at the bottom of the trench. The metal layer is then shaped by and patterning the photoresist deposited on the metal layer and etching the metal layer. Thereafter, the photoresist is stripped from the patterned metal layer. This method involves depositing photoresist into a deep trench and then patterning and stripping the photoresist. In certain applications, such a method may not be preferred.

Figure 6A:
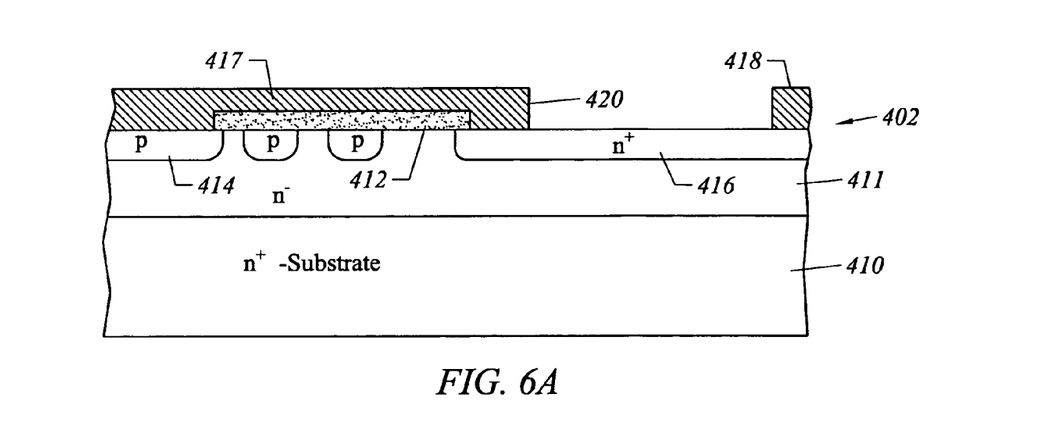
FIGS. 6A–6D illustrates a method of forming a power device having all electrodes on the same side of a substrate assembly according to one embodiment of the present invention.

In another embodiment, the cathode or drain is formed by using a lift-off process, as illustrated in FIGS. 6A–6D. FIG. 6A illustrates a substrate assembly or wafer 402 including a substrate 410 and an epi layer 411. A passivation layer 412 is formed over the epi layer 411. A p-well 414 is formed on the left side, and a n-well 416 is formed on the right side of the epi layer 411. The p-well is subsequently used to define gate and source regions (not shown). The n-well defines the areas where a trench and a channel stopper are to be formed.

A photoresist 418 is formed overlying the substrate assembly. In one embodiment, the photoresist 418 is patterned to have an edge at a middle point of the lateral extension of the trench to be formed. The edge 420 is then used to align the saw and form the trench. In another embodiment, the photoresist is patterned to expose a portion of the substrate assembly whereon the trench is to be formed, so that the saw is centered on the opening of the photoresist.

Figure 6B:
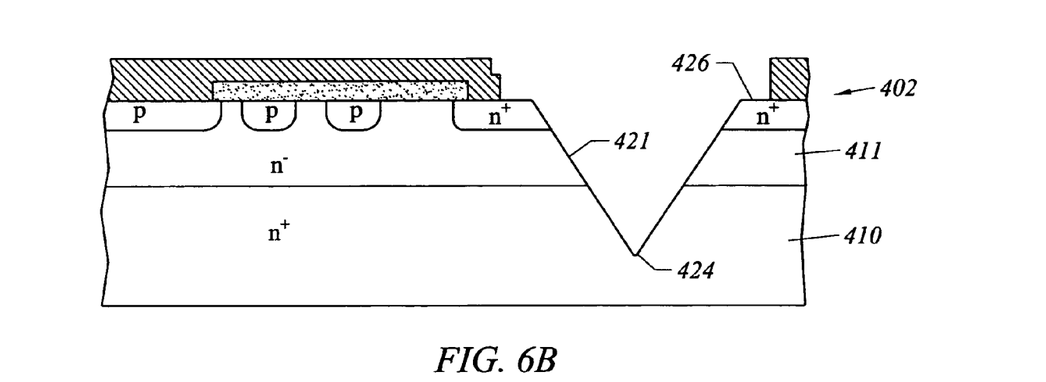

A saw, e.g., V-shaped saw, is used to saw a trench 421 (FIG. 6B). The trench has a lower portion 424 that extends into the substrate 410. In one embodiment, the lower portion extends at least about 20 micron into the substrate. The sidewalls of the trench that have been damaged by the sawing process is repaired by an isotropic etch method, wet or dry. The isotropic etch may also be used to round the tip or corners of the trench. A contact area 426 is defined on one side of the trench. The contact area is about 0.05 mm to about 1 mm wide, preferably about 0.2 mm. The contact area will be used to bond the cathode or drain to a solder ball or a lead for external electrical coupling, as will be explained below.

Figure 6C:
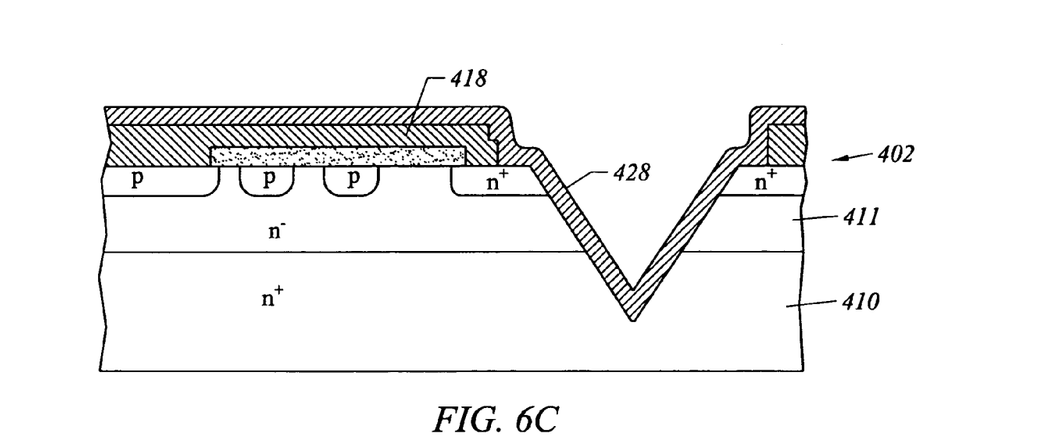
Figure 6D:
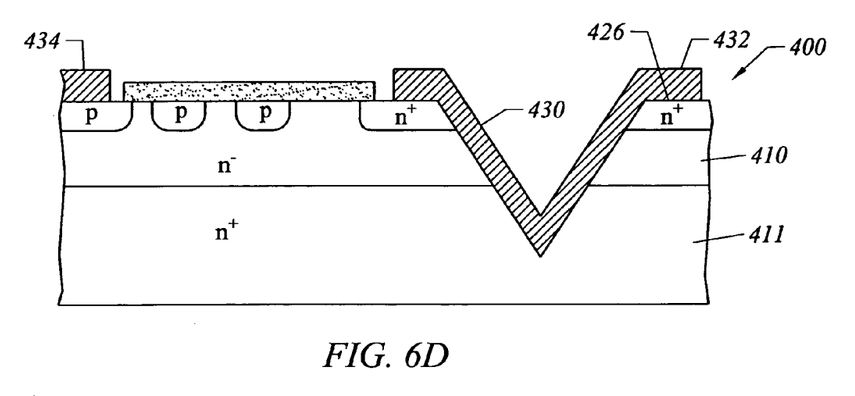

A metal layer 428 is formed overlying the trench and the patterned photoresist (FIG. 6C). The metal layer is patterned using a lift-off process, i.e., the photoresist layer 418 is lifted off from the substrate assembly. This may be done using a thermal process, where the substrate assembly is heated to a certain temperature, e.g., about 400° C., to "lift-off" the photoresist from the substrate assembly. Alternatively, the photoresist may be lifted off using a chemical process by exposing the photoresist to a selected solvent, e.g., Acetone. When the photoresist layer is lifted-off, the metal layer overlying it is also removed, so that a portion 430 (or electrode) that are deposited on the exposed substrate assembly remains to define a cathode or drain (FIG. 6D). The electrode 430 includes a contact pad 432 provided over the contact area 426. A solder bump is formed thereon to form an electrical coupling to the an external node.

After removing the photoresist, a metal layer 434 is formed and patterned overlying the p-well to define a gate. Alternatively, the metal layer 434 may be formed prior to the formation of the trench, or metal layer 434 may be formed and patterned simultaneously with metal layer 430.

Figure 7:
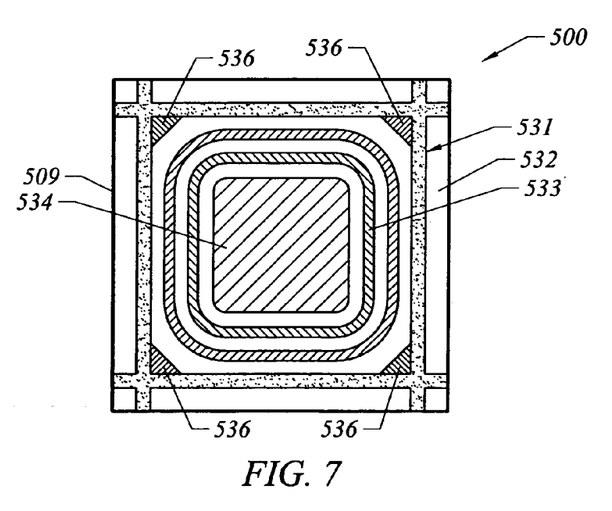
FIG. 7 illustrates a top plan view of a power device having all electrodes on the same side of a substrate assembly according to one embodiment of the present invention.

FIG. 7 illustrates a top plan view of a power device 500, e.g., IGBT, formed on a die or substrate assembly 509 according to one embodiment of the present invention. One or more trenches 531 are formed at peripheries of the die 509. In this embodiment, four trenches are formed on four sides of the die. A contact pad 532 is formed on one side (right or left) of each of the trenches. One or more guard rings 533 are formed within inner sides of the trenches. An active area 534 is provided within the guard ring. In one embodiment, the contact pad 532 are provided on inner corners 536 defined by the trenches 531 to reduce the die size.

Figure 8:
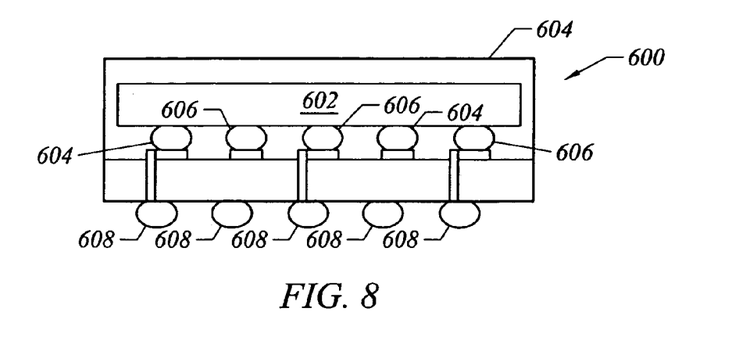
FIG. 8 illustrates a cross-sectional view of a power device packaged using a flip-chip technology according to one embodiment of the present invention.

FIG. 8 illustrates a packaged power device 600 in a flip-chip format according to one embodiment of the present invention. The device includes a die 602 and an external casing 604. The die 602 corresponds to the die 500 of FIG. 7. A plurality of first solder bumps 604 is coupled to a contact pad and drain (not shown) of the die. A plurality of second solder bumps 606 are coupled to the gate and source (not shown) of the die. The bumps 604 and 606 are, in turn, coupled to a plurality of solder balls 608 that are used as electrical connections to external circuits.

Since the gate, source, and drain of the die are all provided on one side (top side) of the die, the bumps 604 and 606 may be directly coupled to the these parts without using wire bonding, thereby reducing the size of the packaged device 600 considerably. Accordingly, the power device 600 may be used in miniature electrical apparatus without unduly increasing the size of the apparatus. In one embodiment, the packaged device 600 is configured to handle 0.25 ampere, 0.5 ampere, or 1 ampere or more and provided with a breakdown voltage rating of at least 50 volts or more. In one embodiment, the device 600 is configured to handle at least 100 volts or more, 300 volts or more, 500 volts or more, or 1000 volts or more, or 1200 volts or more, or 1500 volts or more.

The present invention has been described using specific embodiments above. For example, the teachings of the present invention is not limited to diodes or IGBTs and may be implemented in other power devices, e.g., power MOSFETs. One or more modifications or changes may be made on the specific embodiments disclosed above without departing from the scope of the present invention. Accordingly, the scope of the present invention is defined by the appended claims.

What is claimed is:

1. A diode configured to provide a vertical current flow, the power device comprising:
    a substrate assembly including an upper surface and a lower surface, the substrate assembly including a first layer and a second layer, the first layer overlying the second layer and having different conductivity than the second layer;
    a first electrode provided proximate the upper surface;
    a second electrode provided proximate the upper surface, the second electrode being spaced apart from the first electrode;
    a trench proximate the upper surface and extending into the first layer and at least a portion of the second layer, the second electrode being formed on the trench and contacting the second layer, the trench extending at least about 5 microns into the second layer; and a metal layer formed on the lower surface of the substrate assembly to provide a conductive path between the first and second electrodes, wherein the second layer is configured to provide a current path between the first and second electrodes, so that current flows vertically downward from one of the first and second electrodes to the second layer and then to the other of first and second electrodes from the second layer, wherein the current is 1 ampere or more.

2. A power device, comprising:

a first layer of first conductivity having a first surface and a second surface;

a second layer of second conductivity provided below the second surface, the second layer having a higher conductivity than the first layer;

a first electrode provided proximate the first surface of the first layer;

a groove extending into the second layer from the first surface of the first layer, the groove extending at least about 10 microns into the second layer;

a second electrode formed overlying the groove and contacting the second layer, and a conductive layer provided below the second layer, wherein the second layer and the conductive layer are configured to provide a current path between the first and second electrodes, wherein the power device is a diode.

3. The power device of claim 2, wherein the first layer is an epi layer having a thickness of at least about 5 microns.

4. The power device of claim 2, wherein the device is configured to handle a potential difference of at least about 75 volts between the first and second electrode.

5. A power device configured to provide a vertical current flow, the power device comprising:

a substrate assembly including an upper surface and a lower surface, the substrate assembly including a first layer and a second layer, the first layer overlying the second layer and having different conductivity than the second layer;

a first electrode provided proximate the upper surface;

a second electrode provided proximate the upper surface, the second electrode being spaced apart from the first electrode;

a trench proximate the upper surface and extending into the first layer and at least a portion of the second layer, the second electrode being formed on the trench and contacting the second layer, the trench extending at least about 10 microns into the second layer; and a metal layer provided proximate the lower surface of the substrate, wherein the second layer and the metal layer are configured to provide a current path between the first and second electrodes, so that current flows vertically downward from one of the first and second electrodes to the second layer and then to the other of the first and second electrodes via a conductive layer, wherein the current is 1 ampere or more, wherein the power device is a diode.

6. The power device of claim 5, wherein the trench extends at least about 20 microns into the second layer.

7. The power device of claim 5, wherein the power device is configured to handle a potential difference of at least about 50 volts between the first and second electrodes.

8. A power device configured to provide a vertical current flow, the power device comprising:

a substrate assembly including an upper surface and a lower surface, the substrate assembly including a first layer and a second layer, the first layer overlying the second layer and having different conductivity than the second layer;

a first electrode provided proximate the upper surface;

a second electrode provided proximate the upper surface, the second electrode being spaced apart from the first electrode;

a conductive layer provided on the lower surface of the substrate; and a trench proximate the upper surface and extending into the first layer and at least a portion of the second layer, the second electrode being formed within the trench and contacting the second layer, the trench extending at least about 5 microns into the second layer to provide a suitable current path coupling the first and second electrodes, wherein the second layer and the conductive layer are configured to provide a current path between the first and second electrodes, so that current flows vertically downward from one of the first and second electrodes to the second layer and then to the other of the first and second electrodes via the conductive layer provided on the lower surface of the substrate, wherein the power device is a diode.

9. The power device of claim 8, wherein the first layer is about 50 microns or more, wherein the conductive layer is a metal layer.

10. The power device of claim 8, wherein the first layer is an epi layer and the second layer is a semiconductor substrate having a sufficient concentration of impurities therein to serve as the current path between the first and second electrodes.

11. The power device of claim 8 wherein the trench extends at least about 20 microns into the second layer to provide a suitable current path coupling the first and second electrodes.

12. The power device of claim 8, wherein the device is configured to handle about 1 ampere or more.

13. The power device of claim 8, further comprising:

a plurality of solder bumps of first type electrically coupling the first and second, electrodes from the upper surface without use of a wire.

14. The power device of claim 13, further comprising:

a plurality of solder bumps of second type electrically coupling the plurality of solder bumps of first type, the plurality of solder bumps of second type being configured to be coupled to external electrical circuits.

15. The power device of claim 8, wherein the first layer is of first conductivity, and the second layer is of second conductivity, the second layer having a greater conductivity than the first layer, wherein the current is 1 ampere or more, wherein the conductive layer provided on the lower surface of the substrate is a metal layer.

16. The power device of claim 15, wherein the first layer is about 1 micron or more.

17. The power device of claim 15, wherein the first layer is about 10 microns or more, wherein the conductive layer is a metal layer.

* * * * *